United States Patent [19]

Fiset

[11] Patent Number: 5,589,719

[45] Date of Patent: Dec. 31, 1996

[54] CARD OUT OF SOCKET DETECTOR FOR IC CARDS

[76] Inventor: Peter D. Fiset, 5 Upper Loudon Rd., Loudonville, N.Y. 12211

[21] Appl. No.: 401,778

[22] Filed: Mar. 10, 1995

[51] Int. Cl.⁶ ........................................... H05K 1/11
[52] U.S. Cl. .................. 307/131; 307/147; 361/737; 361/736; 439/79; 439/296
[58] Field of Search ........................... 307/131, 147, 307/125, 116; 361/737; 365/226; 340/825; 439/296, 79; 235/441; 361/736

[56] References Cited

U.S. PATENT DOCUMENTS

| | | | |
|---|---|---|---|
| 5,334,046 | 8/1994 | Brouilette et al. | 439/540 |
| 5,365,221 | 11/1994 | Fennell et al. | 340/636 |
| 5,384,492 | 1/1995 | Carlson et al. | 307/147 |
| 5,408,386 | 4/1995 | Ringer et al. | 361/785 |
| 5,451,933 | 9/1995 | Stricklin et al. | 340/825.06 |
| 5,463,261 | 10/1995 | Skarda et al. | 307/131 |

Primary Examiner—William M. Shoop, Jr.
Assistant Examiner—Albert W. Paladini
Attorney, Agent, or Firm—James W. Pemrick

[57] ABSTRACT

The present invention discloses a novel card out of socket detector circuit for IC cards, especially PCMCIA type cards. Multiple uses of the card detect signal in the IC card interface are provided. The disconnection of system pins is detected and the generation of a card out of socket response signal is created. Such as in the case of high vibration when a connection is temporarily disconnected. A power supply ramping circuit is provided so that when the IC card is connected or disconnected from the host terminal unit there are no voltage spikes within the IC card which will corrupt the operation of certain types of memory particularly in the case of voltage supply sensitive battery backed DRAM IC cards. A power supply circuit is provided which is capable of boosting a voltage from a power source. A controlled transfer from a first removable battery to a second fixed rechargeable battery is also provided that does not create excessive voltage bumps.

13 Claims, 4 Drawing Sheets

CARD OUT OF SOCKET DETECTOR FOR IC CARDS

BACKGROUND OF THE INVENTION

1. Field of the Invention

The present invention relates to IC card circuits, and more particularly to a circuit for detecting the completed connection of an IC card to a terminal.

2. Description of the Background

Portable cards having various combinations of memory, mass storage, and communications functions such as IC cards are known in the prior art. Most recent IC cards are designed to meet an industry standard interface specification, although many non-standard IC cards have been described also. The most common standard adopted by the electronics industry has been set forth by the Personal Computer Memory Card Interface Association (PCMCIA). The electronics manufacturers who are members of the PCMCIA meet and agree upon the definition of a standard.

The PCMCIA sets standards that allow for increased compatibility between host computer systems and the peripheral IC cards which can be attached to the host computer system. The standard defines the interface requirements but does not dictate the particular circuit implementation used to meet the criteria of the specification.

The IC card is usually carried by a user and inserted into terminal units of various systems in order to use the IC card. The terminal unit may or may not be powered up at the time the IC card is inserted into or removed from the terminal unit. It has been a goal of the prior art to have a mode of use of an IC card referred to by the industry as "hot-swapping". Hot-swapping implies that an IC card can be inserted or removed from a terminal unit independent of the state of the host terminal. The host terminal unit may or may not be operating on the IC card when the card is removed. Host terminal units capable of hot-swapping are electrically compatible with the action of an IC card being connected onto or removed from the host terminal.

A technique which is known quite well, and required to meet the standards set by the PCMCIA, is to have two Card Detection (CD) connections on the connector between the host terminal unit and the IC card. These pins are found on the outside edges of the connectors, and there are usually two such pins called CD1 and CD2, located at opposing ends of the array of contacts which comprise the connector. If the card is inserted improperly, such as on an angle, then one of the CD1 or CD2 sockets on the IC card will not make contact with the associated pins of the host terminal. If both CD1 and CD2 make contact with the host terminal unit then the host terminal unit recognizes that a card is present. The PCMCIA standard recommends electrically connecting CD1 and CD2 pins to the ground pins. When the host terminal controller detects a voltage less than 0.8 volts, on either host terminal card detect pin, CD1 and/or CD2, then the host recognizes the state of having an IC card attached to the host terminal IC card connector.

The PCMCIA standard specifies the length for each pin on the host connector. The power supply, and ground contacts are the longest at 0.197+/−0.004 inches, the card detect pins are the shortest at 0.0138+/−0.004 inches, all other pins are an intermediate length of 0.167+/−0.004 inches. On the IC card side all the socket contacts are the same length.

The staggering of the pins allows for hot-insertion of an IC card into a host terminal and also hot removal of an IC card from a host terminal. First the power pins contact, supplying power to the card so that when the signal pins contact next, the inputs are not latched due to too much current sinking into the protection diodes commonly found on CMOS integrated circuits. Similar rationale for the removal. The card is inserted slowly relative to the speed at which the computer and circuits can respond to connections being made sequentially with respect to time. Thus the proper sequencing of the operations required to preserve the integrity of the IC card is performed.

The PCMCIA specification calls specifically for the card detect pins, CD1 and CD2 to be the shortest pins on the host connector. This allows for the other signal of the IC card to be securely connected before the host terminal recognizes that a card is present.

U.S. Pat. No. 5,016,223 granted to Kimura, describes in column 12, line 32, use of "the shortest contact of the parts connected to the terminal unit" as useful for a card detect means.

A critical requirement in the use of the staggered contact scheme is the speed of card insertion which will maintain the allowed time for sequencing the IC card connections. If a card is inserted too fast for the system to respond then the IC card may be subjected to conditions at which it will fail to operate reliably. Such as in the case of a large capacitor on the power supply that has not charged up fully from the power supply pins, and thus the signal pins could leak current through the input protection diode to the power supply. If a card is inserted too fast then the benefits of having staggered contacts is diminished.

The specification of the physical length of the sockets of the IC card allow for a controlled transition for the insertion of the IC card into and removal of the IC card from the host terminal unit.

The PCMCIA standard recommendations state that the card detect pins on the IC card should be directly connected to ground and the ground pins on the IC card. IC cards meeting the PCMCIA standard are required to hold the CD1 and CD2 below 0.8 volts.

The PCMCIA specification requires the host terminals to electrically connect the CD1 and CD2 male pins to a system voltage such as +5 v through a pull-up resistor greater than a minimum value defined by the specification (10 KOhms or larger). Therefore, if the host terminal controller senses a voltage near ground on the CD1 and CD2 pins then an IC card is present and system initialization processing begins. If the host terminal senses a voltage near the system power supply voltage on the card detect pins of the host connector, then an IC card is not connected or has been disconnected. In the case of the disconnection a system disconnection processing can begin.

As the IC card is removed from the host terminal unit the CD1 and CD2 contacts disengage first. This provides a certain amount of time before the power supply contacts are disconnected and additional time before the data, address, and control contacts are disengaged. In the first amount of time, the host terminal card socket controller unit generally generates an interrupt to the host terminal CPU to immediately suspend operations on the IC card. By the time the power supply pins disconnect, the host terminal usually but not in all circumstances should be able to spend operations on the IC card.

It has also been shown in the prior art that the IC card circuit includes a power supply voltage detection circuit that senses the condition of a disconnected power supply pins or the computer powering down. The prior an shows that the power supply voltage is compared to a set point and this comparison output is used to suspend access to the IC card upon detecting the power supply from the host terminal has been removed or is shutting down. This method of protecting the IC card from erroneous access from the host terminal unit is limited in its effectiveness, because controllers are more susceptible to error during power supply cycling. There are additional conditions under which failure can occur. Such as if the card were inserted or removed too fast for the IC card and the host terminal to respond with the proper sequencing of the circuits.

There are the following problems in the conventional IC cards that have been described in the prior art. That is, 1) The circuit relies on the kinetic speed of the card being inserted and extracted to provide the required time for proper sequencing of the contacts engagements and disengagement.

2) The circuit does not account for problems with contacts other than the card detect pins not making contact. Any of the contacts can remain unconnected or can become disconnected from vibration, and from debris between the contacts.

3) The power supply does not ramp up and down, but is subject to a step function. This could cause problems with dynamic random access memories, (DRAM), which rely on the voltage of the capacitors being maintained relative to the power supply. This is a problem when DRAM is intended to replace static random access memory, (SRAM), PCMCIA memory IC cards.

4) The circuit is asynchronous; some IC cards will not be immediately ready to function, this circuit assumes that there will be no need for a long setup on the card before initialization commands are sent from the terminal. This circuit does not allow the IC card time to setup. SRAM cards do not require this time, but other cards such as battery backed DRAM have to be synchronized prior to access.

5) There is no provision to ramp up the power supply on the IC card as required by circuits on the IC card. Again, DRAM in a special low voltage battery backup mode need to be ramped up to the operating voltage at a limited rate, prior to use. A voltage spike or bump can cause error in refreshing the DRAM. The power supply may be subject to a rapid rise is the voltage level when connected to a host power supply. Some voltage sensitive circuits, especially dynamic random access memory, common in the industry and referred to as DRAM, have specifications which limit the change in the power supply voltage over time. DRAMs will fail to maintain data properly if the power supply voltage changes too quickly.

6) The circuit relies on the host controller to determine the state of the card in the socket and there is no provision for the card to determine directly that it is completely attached to the host.

The prior art does not show a voltage ramping circuit when switching over from the host power supply to the battery power supply. The prior art shows a simple pass transistor that isolates the host power supply from the circuit which remains powered by the battery backup power supply.

It is the purpose of the present invention to overcome the disadvantages of the prior art by disclosing an improved circuit which provides for increased reliability and functionality in the detection of the conditions under which the IC card can protect itself from erroneous access.

SUMMARY OF THE INVENTION

The present invention was made in order to solve the previous problems of the prior art, and it is an object of the present invention to provide an IC card with a card detect signal within the IC card that will provide an increase in functionality and reliability by multiple uses of the of the card detect signal in the IC card interface.

Another object of the present invention is to detect the disconnection of system pins and to generate a card out of socket response. Such as in the case of high vibration when a connection is temporarily disconnected. This signal is again combined with the card out of socket signal to maintain the integrity of the proper operation of the IC card.

Another object of the invention is to provide a power supply ramping circuit so that when the IC card is connected or disconnected from the host terminal unit there are no voltage spikes within the IC card which will corrupt the operation of certain types of memory particularly in the case of voltage supply sensitive battery backed DRAM IC cards.

Another object of the invention is to show the use of the above circuit in a variety of peripheral types, including but not limited to memory cards, SRAM, DRAM, FLASH, EEPROM, EPROM, PROM, hard disk drives, I/O cards, communications cards, video cards, bus controller cards, sound cards, multimedia cards, all of which conform to one or more standard interface with a card detection means.

Another object of the invention is to provide a power supply circuit which is capable of boosting a voltage from a power source, including a battery.

Another object of the invention is to provide a controlled transfer from a first removable battery to a second fixed rechargeable battery that does not create excessive voltage bumps.

Another object of the invention is to provide a means by which the PCMCIA card controls the voltage on the card detect pins in order to control the host. The PCMCIA card can control the state of the host by changing the voltage of this pin. Even if the card is completely in the socket the card can simulate being out of socket by this means. This would be useful to keep the host from using a non-functional card, or an un-initialized card, or an unauthorized or protected card. This feature provides self determination of status for smart IC cards.

A still further object of the present invention is to provide an IC card circuit for a portable IC card selectively insertable and extractable from a host terminal unit thereby connecting and disconnecting the IC card circuit from the host terminal unit having a function generating circuit, an internal power supply for applying a voltage to the function generating circuit to maintain the proper sequencing of states of the function generating circuit when the IC card circuit is not connected to the host terminal unit, a first card detect socket for mating with a first card detect pin of the host terminal connector, a second card detect socket for mating with a second card detect pin of the host terminal connector, a card operating properly detector for detecting the ability of the portable IC card to function properly, responsive to the state of the internal power supply and responsive to the state of the function generating circuit, a first transistor for receiving current into the base of the first transistor from the host terminal's first card detect pin, a first impedance means for biasing the collector of the first transistor to said internal power supply, a second transistor for receiving current into the base of the second transistor from the host terminal's second card detect pin, a second impedance means for biasing the collector of the second transistor to the internal power supply, a logic element for outputting a card insertion and extraction signal responsive to signals from the collectors of the first and second transistors, a power input terminal for supplying power to the internal power supply from the host when the IC card is connected to the host, a power switch connected in series between the power input terminal and the internal power supply, and a supply voltage detecting circuit for receiving the card insertion and extraction signal indicative of the connection with and disconnection from the host terminal unit and the voltage of said internal power supply for generating an output signal for the opening and closing of the power switch.

Yet another object of the present invention is to provide an IC card circuit for a portable IC card where the power switch is a transistor, and the internal power supply includes a voltage ramping power supply circuit or a voltage step up/down power supply circuit.

A still further object of the present invention is to provide an IC card circuit for a portable IC card having a first controlled impedance for selectively controlling current flow to the base of the first transistor, responsive to said card operating properly detector, and where the first controlled impedance is an analog switch.

Yet another object of the present invention is to provide an IC card circuit having a second controlled impedance for selectively controlling current flow to the base of the second transistor, which is responsive to said card operating properly detector, and which is an analog switch.

A still further object of the present invention is to provide an IC card circuit having a third controlled impedance for selectively controlling current flow out of the emitter of the first transistor, responsive to the card operating properly detector, and a fourth controlled impedance means for selectively controlling current flow out of the emitter of the second transistor, responsive to the card operating properly detector, where the impedances are analog switches.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The present invention will be more fully understood by reference to the following detailed description thereof when read in conjunction with the attached drawings, and wherein.

DETAILED DESCRIPTION OF THE PREFERRED EMBODIMENTS

Figure 1:
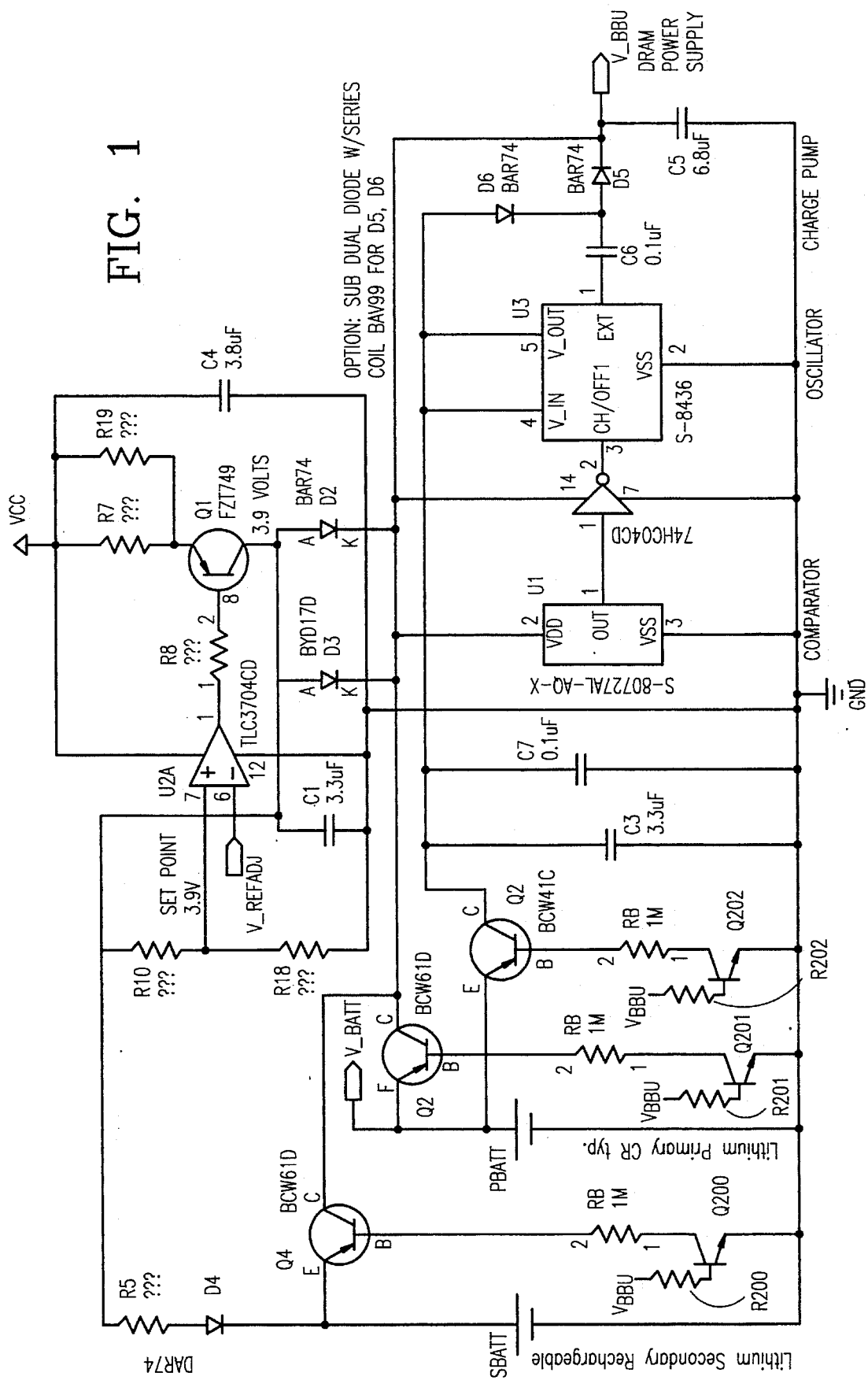
FIG. 1 is a schematic circuit diagram of the IC card power supply circuit according to one embodiment of the present invention.

Referring first to FIG. 1, a construction of an IC card circuit according to an embodiment of the present invention will be described. Bipolar transistors Q200, Q201, Q202 and resistors R8, R9, R11 comprise a circuit which keeps the batteries from discharging prior to host initial power up.

FIG. 1 shows the power supply circuit which regulates the voltage to the DRAM, V_BBU, and regulates the voltage of recharging the lithium secondary battery, SBATT. The power from the host is used when it is available to produce V_BBU, and when it is not present the circuit produces V_BBU from the batteries. Current flows through resistor R7 (and redundant resistor R18) to PNP type transistor Q1. The transistor is biased by current flowing through R8 to allow the transmission of a majority of current from R7 to the bypass capacitor C1. The regulation is provided by comparator U2A which controls current flowing through R8 by comparing V_REFADJ with a SET POINT voltage generated by feeding back the intermediate power supply voltage from C1 through a voltage divider comprised of resistors R10 and R18. V_REFADJ as described above changes with a ramp like waveform to gradually change the voltage of V_BBU. Current is then passed from C1 through diode D3 to the capacitor C5 and the voltage of C5 is V_BBU. D3 does not allow current to pass back to the intermediate power supply circuit when the batteries are providing current to reduce battery power use. The intermediate power supply also supplies power to recharge the secondary battery through resistor R5 and diode D4. R5 limits the current allowed to recharge the rechargeable secondary battery SBATT. D4 does not allow current to pass from the battery to the intermediate power supply when the host power has been removed in order to reduce current flow from the battery. Q4 is used as a switch to pass current in one direction at a low forward voltage drop to keep the current flowing in one direction, i.e. out of the battery SBATT. R6 biases Q4 to allow the transistor to pass current. In one embodiment R8 could have the second pin tied directly to ground in which case current would always be flowing out of SBATT. Alternatively, resistor R200 and transistor Q200 are used to keep current from flowing prior to the first use of the DRAM, so that the PCMCIA card could be stored un-initialized for extended periods with the batteries available but unused. When the PCMCIA card is used for the first time in a host unit, V_BBU will come up thus turning Q200 on in a conducting state which effectively connects the second pin of R8 to ground. Q2 serves a similar purpose to primary battery PBATT as Q4 did for SBATT. Likewise R9, and optional Q201 and R201 provide a similar purpose as do R8, R200, and Q200. The collectors of Q2 and Q4 are tied together to provide current to power the DRAM when host power is not available. Q3, R11, R202, and Q202 provide a similar function as Q2, R9, R201 and Q201. The output of Q3 is used to supply current to a voltage boosting circuit comprised of bypass capacitors, C3, C7, C6 and comparator U4, oscillator U3 and inverter U4, and diodes D6 and D5. C# and C7 are power supply bypass capacitors to effectively lower the impedance of the battery power source. U1 compares the input V_BBU with a set point and if the V_BBU is low then comparator turns output pin 1 on which in inverted by U4 (for logic compatibility) and controls oscillator U3 to oscillate and thus pump charge through C6 and through D6. Current is the supplied through D5 on the alternate phase of the oscillation. By this means the voltage of V_BBU will not fall below a suitable level even if the batteries voltage drops due to a low temperature or a near end of life condition.

Figure 2:
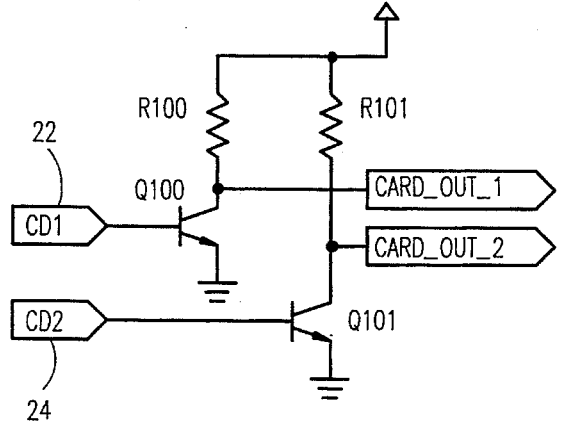
FIG. 2 shows the card out of socket detection circuit.

FIG. 2 shows an embodiment of the card detection circuit which is PCMCIA compliant in the requirement that first and second card detection pins, hereafter referred to as CD1 and CD2 respectively, must be less than 0.8 volts to indicate that a card is present. The pins CD1 and CD2, of the host computer, mate with corresponding first and second card detect sockets. These first and second card detect sockets are located on the IC or PCMCIA card. In all prior art the CD1 and CD2 pins are tied to ground directly. But this present invention makes multiple uses of the CD1 and CD2 pins while still maintaining the requirement of the PCMCIA specification to pull the pins below 0.8 volts in order for a host to detect a card. Transistor Q100 receives current from CD1 when the PCMCIA card is attached to a host that is powered up. This current into the base of the NPN transistor Q100 causes current to flow through R100 to ground, effectively bringing the voltage at the CARD_OUT_1 internal connection to ground. When the card is not inserted or the host power is off, then there is no current into the base of Q100 which causes the current to stop flowing from R100 to ground and thus CARD_OUT_1 goes to a high voltage indicating that the card is not connected to a powered host. Transistor Q101 receives current from CD2 when the PCMCIA card is attached to a host that is powered up. This current into the base of the NPN transistor Q101 causes current to flow through R101 to ground, effectively bringing the voltage at the CARD_OUT_2 internal connection to ground. When the card is not inserted or the host power is off, then there is no current into the base of Q101 which causes the current to stop flowing from R101 to ground and thus CARD_OUT_2 goes to a high voltage indicating that the card is not connected to a powered host. The CARD_OUT_1 and CARD_OUT_2 are connected to the PCMCIA card controller within the card to indicate to the card the state of the card being inserted or not inserted.

Figure 6:
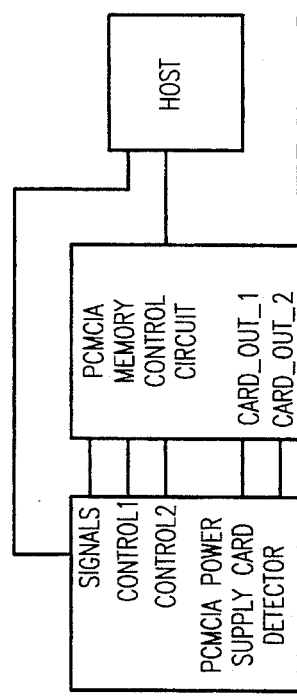
FIG. 6 is a schematic of an alternate card detect circuit which includes a circuit by which the PCMCIA card controls the voltage of the card detect pins.
Figure 12:
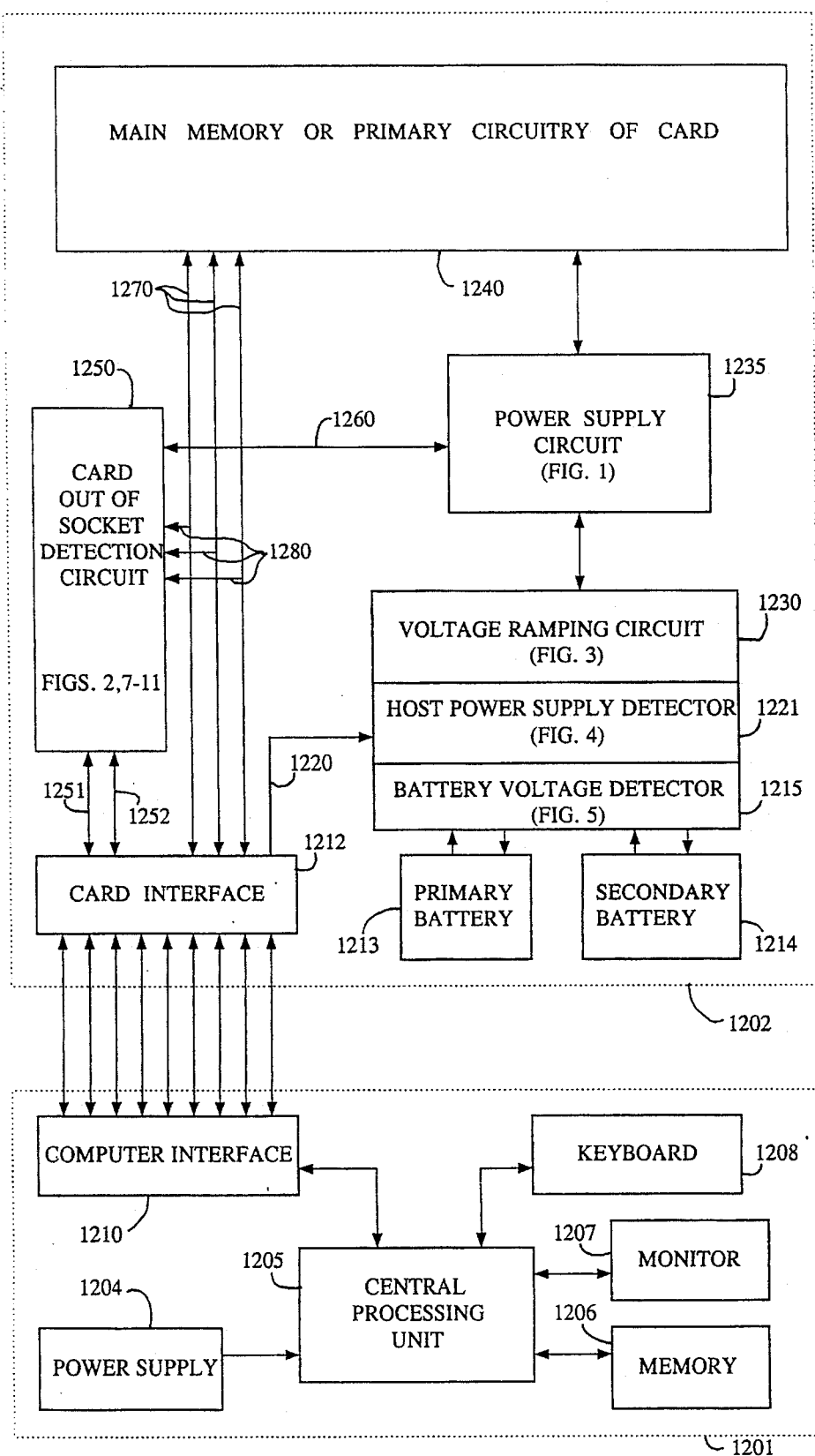
FIG. 12 is a block diagram of the entire operating system showing the interactive operation between all the elements.

FIG. 6 shows the PCMCIA MEMORY CONTROL CIRCUIT is shown as a block diagram and may be implemented in many and various forms, for DRAM, SRAM, and other various storage and or I/O functions. The purpose here is to show the use of such a signal as CARD_OUT_1 and CARD_OUT_2 together or separately in conjunction with a suitable PCMCIA MEMORY CONTROL CIRCUIT. The circuit is shown with connections of power, data, and control signal lumped together. CARD_OUT_1 and CARD_OUT_2 are shown separately connecting the PCMCIA POWER SUPPLY with the PCMCIA MEMORY CONTROL CIRCUIT. FIG. 12 illustrates the actual physical location of where the cards are inserted and how they are connected with respect to the circuit.

Figure 7:
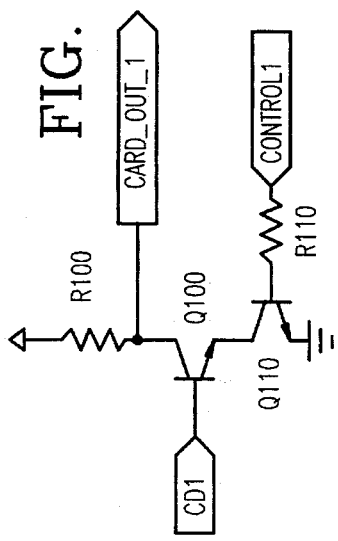

FIG. 7 shows an alternative CD1 detector which includes a new and useful feature that allows the PCMCIA MEMORY CONTROL CIRCUIT to control the function of the card detect circuit. The are many reasons why it could be advantageous for the PCMCIA card to control the CD1 and CD2 lines. The card will be able to simulate a card out of socket condition for reasons such as the card is not ready to be recognized as being connected. The card may recognize an internal error and this is how the card can keep the host from trying to initialize the bus. There are other recommended ways that the PCMCIA specification defines that a card should be initialized, but there are circumstances where the card should not even be recognized as being in the socket, such as maintaining the exact state of the card independently of a host connection. Or the card may be corrupted to the point that any access would corrupt the host or the host resulting actions. CONTROL1 is output from the card controller and input to R110. Current flows through R110 into the base of NPN transistor Q110 when CONTROL1 is in a logically high state, causing current to flow in Q100 and allowing the card detect circuit to operate much as described above in the section referring to FIG. 2. When the card controller needs to simulate an out of socket condition the CONTROL1 is set to a low voltage level and current stops flowing from CD1 to ground causing an out of socket condition to be detected by the host.

Figure 8:
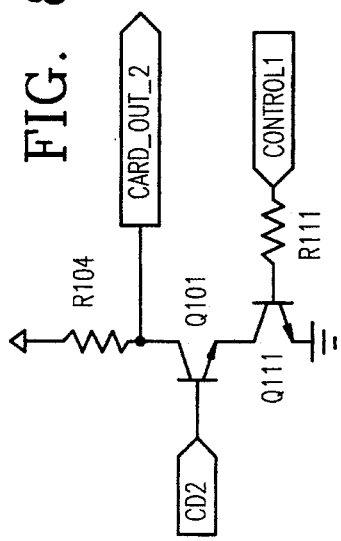

FIG. 8 shows the same circuit as in FIG. 7 except using CD2. In all the application of CD1 a similar circuit is implied for CD2. Although a lower cost version may have different CD1 and CD2 circuits as required by the function.

Figure 9:
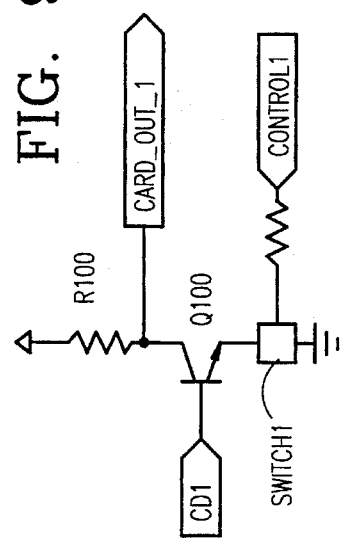

FIG. 9 shows a similar circuit to that of FIG. 7 except a general block diagram is shown indicating a switch function. This switch can be in form an analog switch or a FET type transistor among other types of switches to interrupt the current to allow the simulated card out of socket condition.

Figure 10:
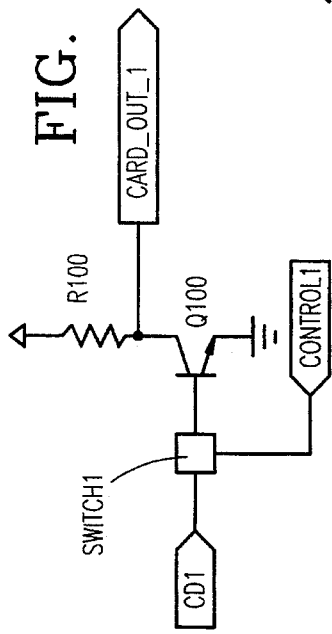
FIGS. 7–11 show various other embodiments for the card out of socket detection circuit.

FIG. 10 shows an alternative topology for the current interruption switch. The function of this switch is effectively the same as that of the switch in FIG. 9; except the current is interrupted form a different point in the circuit.

Figure 11:
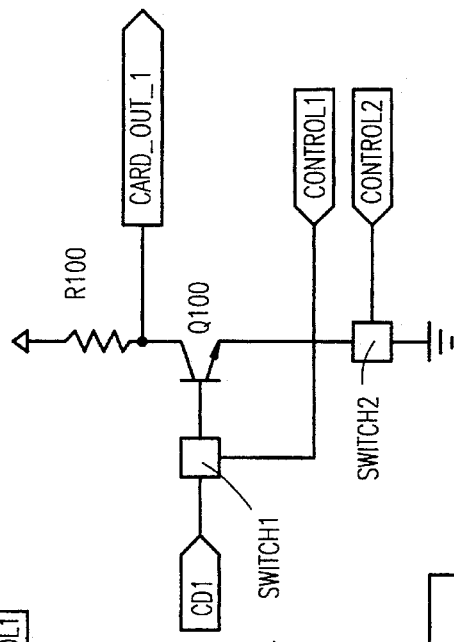

FIG. 11 shows the combination of having a switch to interrupt the current in both locations in the circuit, to effect the same action of causing a simulated card out of socket condition.

Figure 3:
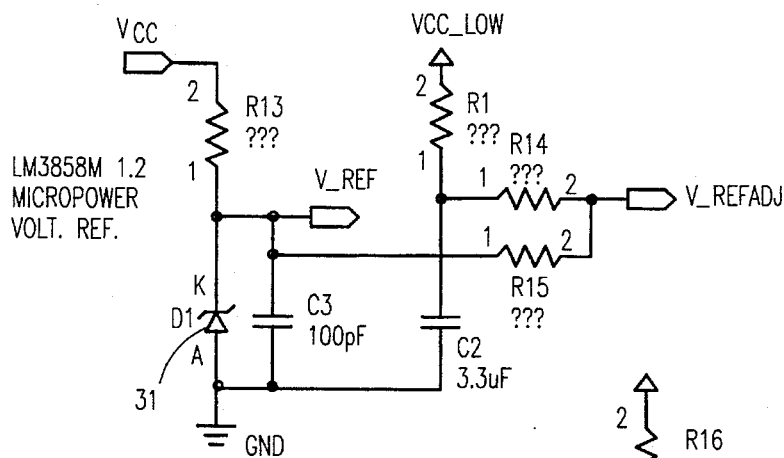
FIG. 3 is a schematic circuit diagram of the voltage ramping circuit.

FIG. 3 shows a voltage ramping circuit. micro power voltage reference 31 is biased by resistor R13 and conditioned by capacitor C3. The voltage produced V_REF is stable over temperature and constant when biased by the host power input VCC. In order to allow for slow changes to the voltage of the DRAM, V_BBU, The reference voltage must be further modified by the resistor capacitance circuit comprised of R1, R14, R15 and C2. C2 is biased by a signal VCC_LOW. The origin of VCC_LOW is described later. VCC _LOW indicates if the host power is applied. R1 allows a limited amount of current to charge up C2. The values of R1 and C2 can be chosen to effect a voltage ramp of an arbitrary time constant. R14 and R15 combine the varying voltage of V_ADJ and V_REF to produce V_REFADJ. V_REFADJ is used to regulate the V_BBU which is the battery backup voltage supplied to the DRAM. The action of V_REFADJ is described later.

Figure 4:
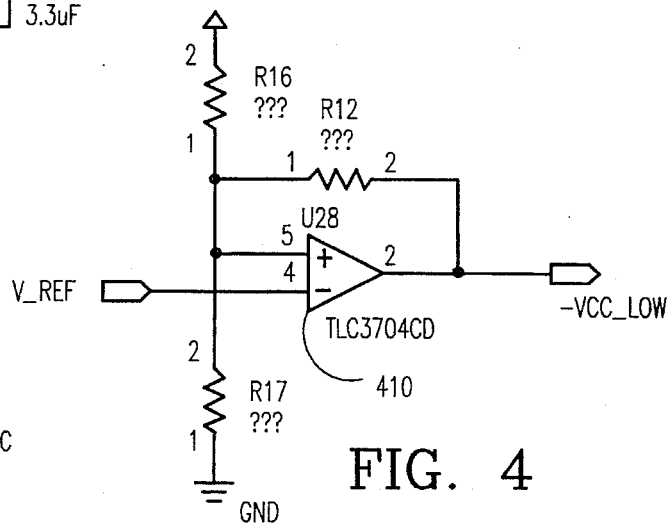
FIG. 4 is a schematic circuit diagram of a circuit that detects the voltage from the host power supply.

FIG. 4 shows the circuit used to produce the signal VCC_LOW. Comparator 410 compares constant voltage V_REF with a voltage divided through resistors R16 and R17 to produce a fractional value of the host power supply voltage. The host power supply voltage can be obtained through VCC or VPP connections defined by the PCMCIA standard. VPP is the programming voltage but is equivalent to the VCC host power supply voltage for non memory programming operation. When the host power supply voltage reaches a prescribed arbitrary value then the comparator changes the output state of VCC_LOW. R12 is used to create hysterysis in the function of the comparator.

Figure 5:
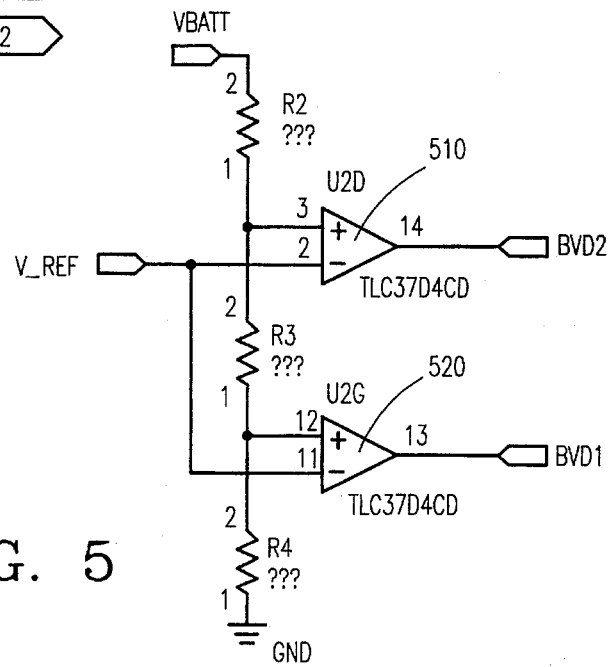
FIG. 5 is a schematic circuit diagram of a circuit that determines the voltages of the primary and secondary batteries and in addition shows the voltage booster circuit, the voltage regulator circuit and primary capacitance of the circuit.

FIG. 5 shows a voltage divider circuit comprised of resistors R2, R3, and R4. These produce ratios of the lithium primary battery voltage, V_BATT. The output of the comparator 516 produces the signal specified by the PCMCIA as VBD2. The output of the comparator 520 produces the signal specified by the PCMCIA as VBD1. The resistors are chosen to produce a certain function when compares to V_REF. In particular VBD1 indicates an imminent condition where the batteries are still functional but could in the near future cease to function. BVD2 indicates that the batteries are not able to support the voltage required to back up the PCMCIA memory card.

The present invention improves on the prior art in the control of the insertion/detachment detector by using a feature included in the standards specification. The card detect pins can be used in a plurality of uses. Prior art uses the CD1 22 and CD2 24 pins for a singular purpose. That purpose is to ground the card detect signal on the host terminal. The card detect signal on the host terminal is held high through a resistor when it is otherwise disconnected from an IC card. The present invention improves on this use by providing a signal to the IC card that a connection to a powered up terminal device has been made. Because any additional time gained by the card to setup operation is significant. Also the signal provided to the IC card has an advantage when the IC card is detached because this gives an earlier warning of an imminent disconnect. The circuit shown in FIG. 2 will detect the current that flows through the resistor connected to the host terminal power supply. The current that flows though the base of the transistor will pull current through the collector and effectively shunt the output of the detector circuit to ground indicating that the IC card is connected to a powered up host terminal unit.

Additionally there can be a second pull-up resistor that can pull the CD1 22 and CD2 24 lines high if there is detected a mode of failure in the card that requires the system to shut down. This is similar to what the insertion/detachment signal the prior art describes. Say that the card fails then the card can indicate to the host terminal host that the card is disconnected, even though the card has not been removed.

The other mode of failure detection that has not been established by the prior art is the use of connection failure detection means coupled with a failure controller to effect the simulated disengagement of the card with the socket. The simulated disengagement is required when say a data signal or any of the other signals on the connector has failed. Such failure call occur when extraneous debris gets caught in the connector and works one of the pins out of connection. The other source of such disconnection or connection failure is vibration, when a contact can fail momentarily. An especially difficult detection id the failure of an address line, because when writing reading back will read back from the failed address represented by the failed address.

Thus a further improvement is a means to detect a failure of a contact that test the signal integrity of the lines. During an access the address lines have to be driven, otherwise some of the lines will float in a high impedance state. A detector on each signal can detect if the signal is connected. One such test mechanism is to pull the signal to a intermediate or third voltage, test for this voltage for a period of time and if it exists then the controller indicates that there is a fault. And the host terminal is indicated that a disconnection has occurred because the CD1 22 and CD2 24 pins are forced to a high state.

It is not necessary to bring both CD1 22 and CD2 24 high. Various forms of implementation are combinations of either one or both of the CD1 22 and CD2 24 can be forced high. The source of the CD1 22 or CD2 24 current interruption can be from a plurality of mechanisms. This scheme is used to simulate an out of socket condition for testing purposes, for special power saving modes, to enable the IC card to control the host to bring the host to a card out of socket state for a variety of reasons.

Also, the connector pin spacing can be simplified, i.e. the card can simulate that the CD1 22 and CD2 24 pins have not yet made contact holding the host terminal in a card out of socket condition, until a preset time elapses when the card can sink the current from the card detect pins on the host starting the initialization process.

This technique allows for a card that is not ready to be inserted into a socket to control the activity of the host independently of the user's intentions. This method will allow the inserting of a card to be synchronized with the ability of the card to respond to the initialization procedure from the host.

This technique keeps a failed card from being initialized by the host. Thus saving the host a possible secondary failure due to corrupted data or corrupted operations.

There are many and various uses and forms of the present invention. These save host resources because the host does not have to deal with a card that was not ready to be dealt with.

The manual switch that the prior art referred to can be included in a source of the card detect current interruption signal. Except due to the plurality of uses of the CD1 22 and CD2 24 signals the signal now has a means to reach the host. The prior art states the availability of a signal directly connected to the host which was the insertion/detachment signal. But there exist many such cards and hosts which do not have this signal. Therefore, it is the advantage of the present invention to use an available signal for multiple purposes.

The prior art from the "PCMCIA" standards manual states that the CD1 and the CD2 lines are to be connected to ground. There is no suggestion for the use of the CD1 and CD2 lines for the purpose of multiple uses and a control scheme which provides an indication to the card that the card has been connected to a host which is powered up.

The card in this case holds the pass transistor open, so substantially no current flows out of the CD1 and CD2 pins while the card is not ready to accept initialization from the host. The card waits for the power supply on the host to come up before the card can get ready to accept the initialization. This generally allows the card more time to set itself up prior to the host requesting access to the cards resources.

One main purpose of the present invention is to minimize the drain current from the battery at all times, and in addition to keep the current drawn from the host low. Therefore, most of the circuit involves using the host current when it is available. For example the comparator 100 of FIG. 1 is used to regulate VCC power to an intermediate voltage V_MID= 3.9 volts nominal.

The voltage ramping circuit will now be described with reference to FIG. 3. The reference section is comprised of diode 31 (LM385BM-1.2) as the active component to regulate a stable V_REF=1.235 volts. Additional voltage dividers and capacitors are used to produce the V_REF_ADJ. V_REF_ADJ ramps up and down when the host VCC comes up and down. The function of this circuit is to provide a smooth transition from the backup voltage level of V_BBU to the operating level of V_BBU. Where V_BBU is the low voltage that is applied to the DRAMs and the active backup circuitry. The details of this circuit cannot be called out until the minimum operating voltage of the DRAMs during battery backup is set. Because the LUNA chip is specified for 3.63 volts to 2.97 volts a decision will have to be made to sleep at a voltage lower than that specified in the operating mode. What voltage will this be? Say it is 2.6 volts minimum, then the ramp will have to start from 2.6 volts and ramp up to 3.3 volts. At any rate, this is the type of circuit that will do that function. Of course, the ramp up/down period will depend on the amount of refreshing and the maximum allowable charge in the DRAM power supply. As an alternative embodiment a digital stepper could be used instead of the voltage ramping circuit illustrated in FIG. 3.

Referring to FIG. 4, comparator 410 is used to detect the host VCC power being removed. This technique relies on VPP1 remaining connected to VCC during the operation of this card, because there is no other voltage specified in the CIS on the card. This gives advance warning of impending VCC loss due to card removal. The card can be put to sleep at the lower voltage without a bump in the V_BBU. Normal power down without card removal is also detected with this circuit. All the comparators have resistor divider circuits to allow complete control over the desired operating threshold voltages.

Referring to FIG. 5, comparators 510 and 520 detect the voltage of the primary battery. The voltage divider resistors 502, 503, 504 are used to set the detection voltage to any level desired.

Since the V_BBU minimum is dependent on the choice of memory used the values will change accordingly. The voltage cannot change more than the specification allows (i.e. 20%) before a full refresh has been performed. If V_BBU min.=3.0 volts, then the booster runs all the time. This is inefficient, but no ramping circuit is needed. If V_BBU min.=2.7 volts, then the booster runs when the battery is low or the temperature is low. Ramping is needed for some types of DRAMs. If V_BBU min.=2.4 volts, then the booster is needed and a ramp up/down is needed.

The capacitance of the power supply system, including that on VCC, V_MID, and V_BBU should be large enough to allow the voltage on V_BBU to drop at a rate that does not bump the DRAMs in the sleep mode even if the drop is from 3.0 volts to 2.7 volts. If a variable booster voltage circuit is used then the reliance on capacitance is not an issue. This would be in a circuit using a TLC3702CD comparator as the detector in the booster regulator instead of the fixed S-807 detector.

This brings up the point that the V_BBU max. could be 3.0 volts. Depending on the choice of V_BBU max. and the choice of V_BBU min. the ramp circuit may or may not be needed. The circuit described here has a V_BBU max. set to 3.3 volts.

An alternative method would be to have a digital line that controls the V_BBU. If the PCMCIA controller will be operating from V_BBU it will be available to digitally control the V_BBU as in a step function instead of the analog RC method shown. The step would not be implemented until the controller determined that the DRAMs had been fully refreshed before applying the next step.

There will of course be questions about the use of PNP transistors instead of P-channel MOSFETs. The bottom line here is that PNP bipolar components do not require special controllers to operate them. Whereas, the MOSFETs require external control to turn them on and off at the appropriate times. While the MOSFET would be preferable in the battery backup path because the forward voltage drop would save 0.1 volts the controller would be required. An in addition the Lithium batteries should not be exposed to even minor reverse charging. The PNP resistor function as low forward voltage diodes. In fact if the design were to be able to tolerate forward voltage drops of 0.6 volts then the PNP transistor could be replaced with diodes. An example of this would be the battery path to the voltage booster oscillator; since the voltage is being boosted the lower supply voltage to the booster could easily be tolerated.

The PNP transistors steer current in the direction that is desired without additional controllers. For the same reason the diodes D2, D# are used to keep the V_BBU current from leaking into the circuit that is not powered during the battery backup sleep mode.

The diodes D2 and D3 provide a means of reducing the current drain from the primary battery when the host power is available. Current from the host flows through R and R11 when the host is powering the card. Likewise, the host powers the booster detector and oscillator parts also.

The booster should be used as a last defense since it is inefficient and loses 50% of the current in the charge pump action. Therefore, maintain a direct connection from the battery to the DRAM as long as possible before using the booster. This will require determining the lowest voltage the DRAMs will sleep comfortably at.

The temperature specification of all the parts meets the PCMCIA specification for SRAM cards for 0 degrees Celsius to 50 degrees Celsius.

The estimated current requirements excluding DRAM current for the circuit is the following:

| Primary battery drain | Host current drain | Conditions |
|---|---|---|
| 0 uA | 120 uA | Host powered up. |
| 6 uA | 0 uA | Host OFF. Booster OFF. |
| 20 uA | 0 uA | Host OFF. Booster ON |

The following additional embodiments could be implemented in the present invention. Use CR type batteries instead of BR type. CR batteries have a higher voltage output and have a soft bow at the end of the cycle which will give a more advanced indication to the user that the batteries need replacing.

Consider using the larger VL-3032 rechargeable lithium battery. It has 100 mAh ratings with an average total life output of 10,000 mAh. This battery could be used initially and only the primary need be used after this. With a certain frequency of use the primary may never be used.

Make all systems with a direct path to the system battery. Allow only 1 mA to flow to the PCMCIA port. In this way the primary battery will never be used. Also, there may be a pin that could be dedicated to this purpose. Unfortunately, the RFSH pin would have been ideal, but it has been learned that this pin is soon to be taken away from us and given to the FLASH camp for use as a card voltage detection pin! How unfortunate, but still it may be good enough to use the VCC pins on the card. Actually, any other pin is a candidate for providing this low level current to the PCMCIA DRAM card when the system is otherwise totally turned off.

Different versions of the DRAM card can be offered. One that is to be used at room temperatures only, and another that can operate in a larger temperature range. The room temperature only card would have lower power drain because the voltage booster would be disconnected. This feature could be incorporated into a single card by throwing an external switch. The feature to power manage the voltage booster could also be incorporated into the card, with some additional power drain for the control. The voltage booster is a small drain when it is in the static state anyway, approximately 2 uA.

The comparator used in the voltage booster design could be replaced by the op-amp TLC251CD single that can go down to 1.4 volts. The TLC25L2CD dual and the TLC25L4CD quad could also be used. These parts have outputs that do not swing rail to rail and therefore would require additional active components to provide the boosted voltage.

Ultimately the easiest design would require the user to change the batteries in a powered up host. But, an equally interesting design would be to have two primary batteries. One would be used only when the replaceable was out of the circuit. This could even be a small battery that could also be replaced. In fact, replace the small one first and the large one second.

FIG. 12 shows one embodiment of the present invention illustrating the interactive operation between all the elements. The host computer 1201 is illustrated in general, showing common components typically associated with such a device. Power supply 1204 could be an external supply or a battery powered internal supply. CPU 1205 is connected to memory 1206, display monitor 1207 and keyboard 1208. Computer interface 1210 is a standard PCMCIA type interface having an array of pins which comply with the PCMCIA standards. Host computer 1201 is shown merely for illustration, and in no way should limit the scope of possible applications.

The IC card 1202, which could be of the PCMCIA type, can be connected to host computer 1201 via card interface 1212. Card interface 1212 comprises a plurality of sockets which mate with the corresponding pins of the host's computer interface 1210. IC card 1202 includes a primary battery 1213 and a secondary battery 1214 as a power source when the IC card 1202 is not connected to host computer 1201. Battery voltage detector 1215, as shown in FIG. 5, monitors the state of charge of the batteries 1213, 1214.

Host power is supplied via signal line 1220 to the host power supply detector 1221, as shown in FIG. 4. This circuitry acts to recharge the primary 1213 and secondary 1214 batteries, as well as, directing power supplied from the host 1201 into the voltage ramping circuit 1230, as shown in FIG. 3. Voltage ramping circuit 1230 supplies power directly to the power supply circuit 1235. This power supply circuit 1235 is illustrated by FIG. 1. The IC card 1202 can function as a variety of devices. It could serve as a modem, external floppy drive, GPS transceiver or as an additional memory source. This memory could be volatile or non-volatile. The main functional block of the card is illustrated by numeral 1240. The block 1240 identifies in general the specific circuitry to accomplish a given task, or a large block of memory.

The card out of socket detection circuit 1250 is connected to the card interface 1212 by signal lines 1251 and 1252. The card out of socket detection circuit 1250 can include any one of the circuits illustrated in FIGS. 2, 7–11. Signal line 1251 corresponds to the signal received from the CD1 pin/socket and signal line 1252 corresponds to the signal received from the CD2 pin/socket. As has been described, the card out of socket detection circuit 1250 can impress a given voltage on the CD1 and CD2 pins to simulate a specific condition. This voltage is impressed on the pins with the intent to control the IC card and the host computer. The signals received from signal lines 1251 and 1252 are also used by the card out of socket detection circuit 1250 to control the power supply circuit 1235 and the host power supply detector 1221. When the IC card is removed, either on purpose or by accident, the signals on lines 1251 and 1252 will be the first to respond. This "early warning" is used by the card out of socket detection circuit 1250 to switch power supply from the host 1201 to the primary 1213 and/or secondary 1214 batteries. Signal line 1260 is used for data communication, control and power supply. Only one line 1260 is shown in the drawing for simplicity, but in practice there would be a plurality of connections between the power supply circuit 1235 and the card out of socket detection circuit 1250.

Data signal lines 1270 connect the main memory/circuit 1240 of IC card 1202 to the card interface 1212. These signal lines serve as the primary transmission path to transfer data between memory/circuit 1240 and host computer 1201. Signal monitoring lines 1280 are connected to the data signal lines 1270. Signal monitoring lines 1280 allow the card out of socket detection circuit to monitor the condition and state of the data signal lines 1270. Data signals that can be monitored may include data, address, control signals and power. If one of the pins or sockets connected to the data signal lines has malfunctioned, due to vibration, dust particles, etc., the card out of socket detection circuit 1250 can identity the fault and impress a false signal on one or both of the card detect signal lines 1251, 1252 to simulate a card out of socket condition.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. An IC card circuit for a portable IC card selectively insertable and extractable from a host terminal unit thereby connecting and disconnecting the IC card circuit from the host terminal unit comprising, a function generating circuit, an internal power supply for applying a voltage to said function generating circuit to maintain the proper sequencing of states of said function generating circuit when the IC card circuit is not connected to the host terminal unit, a first card detect socket for mating with a first card detect pin of the host terminal connector, a second card detect socket for mating with a second card detect pin of the host terminal connector, a card operating properly detector for detecting the ability of the portable IC card to function properly, responsive to the state of said internal power supply and responsive to the state of said function generating circuit;

a first transistor for receiving current into the base of said first transistor from the host terminal's first card detect pin, a first impedance means for biasing the collector of said first transistor to said internal power supply, a second transistor for receiving current into the base of said second transistor from the host terminal's second card detect pin, a second impedance means for biasing the collector of said second transistor to said internal power supply, a logic element for outputting a card insertion and extraction signal responsive to signals from the collectors of said first transistor and said second transistor, a power input terminal for supplying power to said internal power supply from said host terminal unit when the IC card is connected to said host terminal unit, a power switch connected in series between said power input terminal and said internal power supply, and a supply voltage detecting circuit for receiving said card insertion and extraction signal indicative of the connection with and disconnection from said host terminal unit and the voltage of said internal power supply for generating an output signal for the opening and closing of said power switch.

2. The IC card circuit of claim 1 wherein said power switch is a transistor.

3. The IC card circuit of claim 1 wherein said internal power supply comprises a voltage ramping power supply circuit.

4. The IC card circuit of claim 1 wherein said internal power supply comprises a voltage step up/down power supply circuit.

5. The IC card circuit of claim 1 further comprising, a first controlled impedance means for selectively controlling current flow to the base of said first transistor, responsive to said card operating properly detector.

6. The IC card circuit of claim 5 wherein said first controlled impedance means is an analog switch.

7. The IC card circuit of claim 5 further comprising, a second controlled impedance means for selectively controlling current flow to the base of said second transistor, responsive to said card operating properly detector.

8. The IC card circuit of claim 7 wherein said first controlled impedance means is an analog switch, and wherein said second controlled impedance means is an analog switch.

9. The IC card circuit of claim 1 further comprising, a third controlled impedance means for selectively controlling current flow out of the emitter of said first transistor, responsive to said card operating properly detector;

a fourth controlled impedance means for selectively controlling current flow out of the emitter of said second transistor, responsive to said card operating properly detector.

10. The IC card circuit of claim 9 wherein said third controlled impedance means is an analog switch, and wherein said fourth controlled impedance means is an analog switch.

11. A portable IC card selectively insertable into and removable from a host computer interface of a host computer, thereby connecting and disconnecting the portable IC card from the host computer comprising, a main memory or primary circuitry portion which comprises the main functional purpose of said portable IC card, a card interface for connection to said host computer interface, a host power supply detector circuit, a battery voltage detector circuit, a primary battery to supply power to said portable IC card when said portable IC card is not receiving power from said host computer, a power supply circuit, a plurality of data signal lines connected between said main memory or primary circuitry portion and said card interface and, a card out of socket detection circuit connected to said data signal lines, said card interface and said power supply circuit, said card out of socket detection circuit monitoring signals received from said card interface and said data signal lines and, selectively outputting signals to said card interface and said power supply circuit for the purpose of controlling the operation of said portable IC card.

12. The portable IC card of claim 11 where said card interface and said host computer interface are of the PCMCIA type.

13. The portable IC card of claim 11 further comprising, a voltage ramping circuit connected between said power supply circuit and said host power supply detector.

* * * * *